United States Patent
Matsuo et al.

(10) Patent No.: US 7,761,761 B2
(45) Date of Patent: Jul. 20, 2010

(54) SEMICONDUCTOR INTEGRATED CIRCUIT, TEST DATA GENERATING DEVICE, LSI TEST DEVICE, AND COMPUTER PRODUCT

(75) Inventors: Tatsuru Matsuo, Kawasaki (JP); Takahisa Hiraide, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 583 days.

(21) Appl. No.: 11/797,348

(22) Filed: May 2, 2007

(65) Prior Publication Data
US 2007/0288819 A1 Dec. 13, 2007

(30) Foreign Application Priority Data
May 2, 2006 (JP) .............................. 2006-128141
Mar. 14, 2007 (JP) .............................. 2007-065141

(51) Int. Cl.
*G01R 31/28* (2006.01)
(52) U.S. Cl. .................... 714/732; 714/728; 714/729
(58) Field of Classification Search ................ 714/732, 714/738, 726, 728, 739
See application file for complete search history.

(56) References Cited

U.S. PATENT DOCUMENTS

| | | | | |
|---|---|---|---|---|
| 6,061,818 A | * | 5/2000 | Touba et al. | 714/739 |
| 6,708,305 B1 | * | 3/2004 | Farnsworth et al. | 714/739 |
| 6,922,803 B2 | * | 7/2005 | Nakao et al. | 714/738 |
| 7,096,397 B2 | * | 8/2006 | Kundu et al. | 714/732 |
| 7,516,376 B2 | * | 4/2009 | Okano et al. | 714/726 |
| 7,607,059 B2 | * | 10/2009 | Osanai | 714/729 |
| 2002/0124217 A1 | * | 9/2002 | Hiraide et al. | 714/726 |

FOREIGN PATENT DOCUMENTS

JP 2002-236144 8/2002

* cited by examiner

*Primary Examiner*—Kevin L Ellis
*Assistant Examiner*—Steve Nguyen
(74) *Attorney, Agent, or Firm*—Staas & Halsey LLP

(57) ABSTRACT

A pattern correcting device corrects random test patterns generated by pseudo random number pattern generator (PRPG) into test patterns for a test to be input to shift registers. A pattern correcting device corrects the test patterns in unit of specified group, and individually releases correction of the test patterns when the correction in unit of the group is not appropriate. Furthermore, an unknown value mask device masks shift registers that output unknown values based on a control signal, and individually releases a mask of a shift register that outputs a fault value.

3 Claims, 14 Drawing Sheets

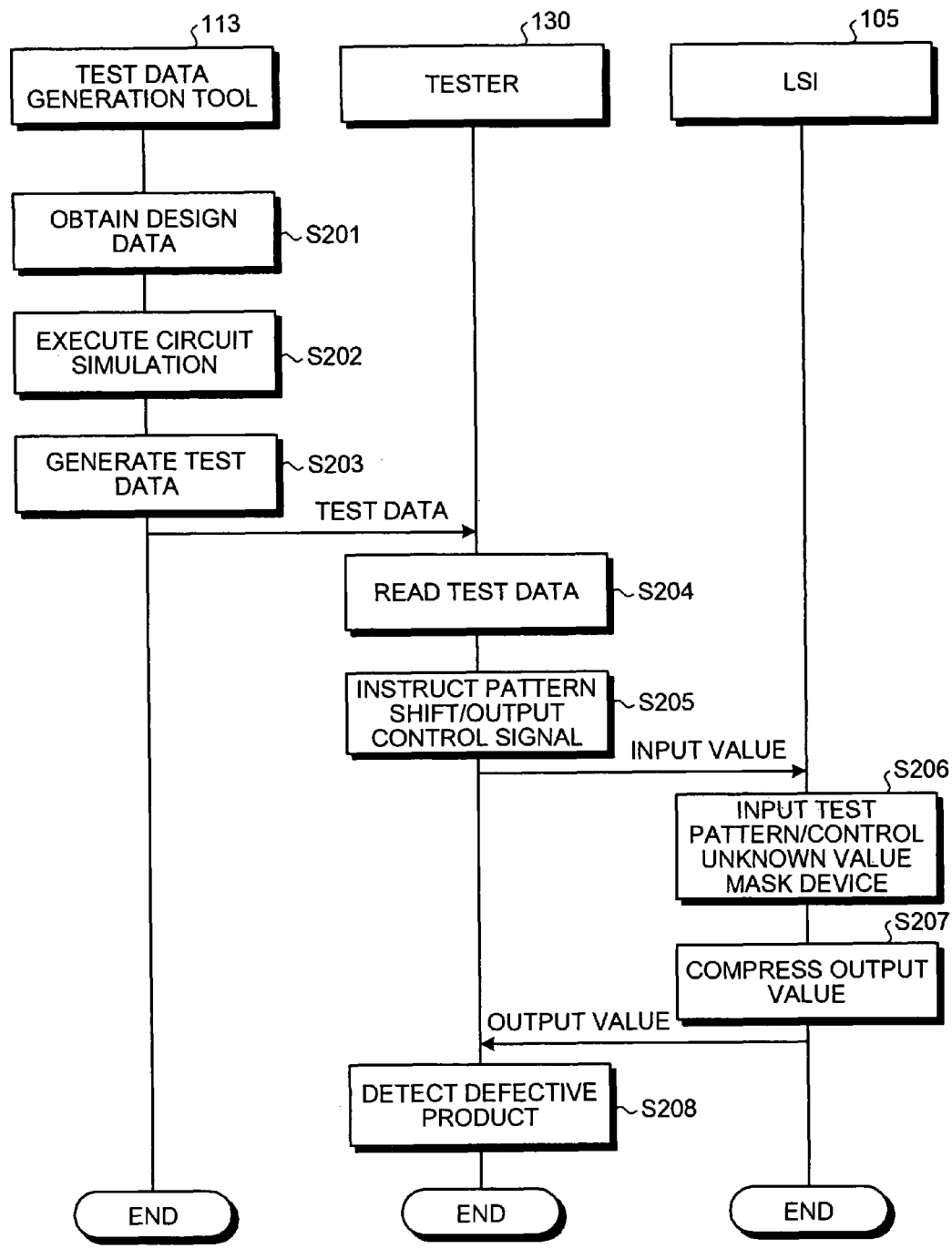

FIG.7

| CTL 0 | CTL 1 | CTL 2 | CTL 3 | R | OPERATION |
|---|---|---|---|---|---|
| 0 | X | X | X | X | PATTERN SHIFT VALUE OF ALL F/F IN INVERTING CIRCUIT, X MASK CIRCUIT IS RESET — 701 |
| 1 | 0 | 0 | A | X | F/F IN INVERTING CIRCUIT CORRESPONDING TO SCAN PATH OF WHICH UPPER ADDRESS IS A IS SET TO 1 VALUE A IS STORED INTO R — 702 |
| 1 | 0 | 1 | A | B | F/F IN INVERTING CIRCUIT CORRESPONDING TO SCAN PATH OF WHICH UPPER ADDRESS IS BA IS RESET — 703 |
| 1 | 1 | 0 | A | X | F/F IN X MASK CIRCUIT CORRESPONDING TO SCAN PATH OF WHICH UPPER ADDRESS IS A IS SET TO 1 THE VALUE A IS STORED INTO R — 704 |
| 1 | 1 | 1 | A | B | F/F IN X MASK CIRCUIT CORRESPONDING TO SCAN PATH OF WHICH UPPER ADDRESS IS BA IS RESET — 705 |

FIG.8

| INPUT VALUE | OPERATION | |
|---|---|---|
| 00xxxx | PATTERN SHIFT | ~801 |
| 01xxxx | SET CORRECTING PORTION OF PATTERN CORRECTING DEVICE OF ADDRESS xxxx | ~802 |
| 10xxxx | SET CORRECTING PORTION OF UNKNOWN VALUE MASK DEVICE OF ADDRESS xxxx | ~803 |

| SCAN PATH ADDRESS | ATPG | PRPG | INPUT TO SCAN PATH | | | | | | | | |
|---|---|---|---|---|---|---|---|---|---|---|---|
| | | | INITIAL | 1 | 2 | 3 | 4 | 5 | 6 | 7 | 8 |
| 0000 | X | 1 | 1 | 1 | 1 | 1 | 1 | 1 | 1 | 1 | 1 |
| 0001 | 0 | 1 | 1 | 0 | 0 | 0 | 0 | 0 | 0 | 0 | 0 |
| 0010 | 1 | 0 | 0 | 0 | 1 | 1 | 1 | 1 | 1 | 1 | 1 |
| 0011 | X | 0 | 0 | 0 | 0 | 0 | 0 | 0 | 0 | 0 | 0 |
| 0100 | X | 0 | 0 | 0 | 0 | 0 | 0 | 0 | 0 | 0 | 0 |
| 0101 | 1 | 1 | 1 | 1 | 1 | 1 | 1 | 1 | 1 | 1 | 1 |
| 0110 | X | 0 | 0 | 0 | 0 | 0 | 0 | 0 | 0 | 0 | 0 |
| 0111 | 0 | 1 | 1 | 1 | 1 | 0 | 0 | 0 | 0 | 0 | 0 |
| 1000 | 1 | 0 | 0 | 0 | 0 | 0 | 1 | 1 | 1 | 1 | 1 |
| 1001 | 1 | 0 | 0 | 0 | 0 | 0 | 0 | 1 | 1 | 1 | 1 |
| 1010 | 0 | 1 | 1 | 1 | 1 | 1 | 1 | 1 | 0 | 0 | 0 |
| 1011 | 0 | 1 | 1 | 1 | 1 | 1 | 1 | 1 | 1 | 0 | 0 |
| 1100 | 0 | 1 | 1 | 1 | 1 | 1 | 1 | 1 | 1 | 1 | 0 |
| 1101 | X | 0 | 0 | 0 | 0 | 0 | 0 | 0 | 0 | 0 | 0 |
| 1110 | X | 1 | 1 | 1 | 1 | 1 | 1 | 1 | 1 | 1 | 1 |
| 1111 | X | 1 | 1 | 1 | 1 | 1 | 1 | 1 | 1 | 1 | 1 |

| | INPUT VALUE |
|---|---|
| 1 | 010001 |
| 2 | 010010 |
| 3 | 010111 |
| 4 | 011000 |
| 5 | 011001 |
| 6 | 011010 |
| 7 | 011011 |
| 8 | 011110 |

| INPUT VALUE | OPERATION | |
|---|---|---|
| 0xxxx | PATTERN SHIFT | ~1001 |
| 100xx | SET CORRECTING PORTION OF PATTERN CORRECTING DEVICE OF UPPER ADDRESS xx | ~1002 |
| 101yy | SET CORRECTING PORTION OF PATTERN CORRECTING DEVICE OF ADDRESS xxyy | ~1003 |
| 110xx | SET CORRECTING PORTION OF UNKNOWN VALUE MASK DEVICE OF UPPER ADDRESS xx | ~1004 |
| 111yy | SET CORRECTING PORTION OF UNKNOWN VALUE MASK DEVICE OF ADDRESS xxyy | ~1005 |

| SCAN PATH ADDRESS | ATPG | PRPG | INPUT TO SCAN PATH ||||||
|---|---|---|---|---|---|---|---|---|
| | | | INITIAL | 1 | 2 | 3 | 4 | 5 |
| 0000 | X | 1 | 1 | 0 | 0 | 0 | 0 | 0 |
| 0001 | 0 | 1 | 1 | 0 | 0 | 0 | 0 | 0 |
| 0010 | 1 | 0 | 0 | 1 | 1 | 1 | 1 | 1 |
| 0011 | X | 0 | 0 | 1 | 1 | 1 | 1 | 1 |
| 0100 | X | 0 | 0 | 0 | 1 | 1 | 1 | 1 |
| 0101 | 1 | 1 | 1 | 1 | 0 | 1 | 1 | 1 |
| 0110 | X | 0 | 0 | 0 | 1 | 1 | 1 | 1 |
| 0111 | 0 | 1 | 1 | 1 | 0 | 0 | 0 | 0 |
| 1000 | 1 | 0 | 0 | 0 | 0 | 0 | 1 | 1 |
| 1001 | 1 | 0 | 0 | 0 | 0 | 0 | 1 | 1 |
| 1010 | 0 | 1 | 1 | 1 | 1 | 1 | 0 | 0 |
| 1011 | 0 | 1 | 1 | 1 | 1 | 1 | 0 | 0 |
| 1100 | 0 | 1 | 1 | 1 | 1 | 1 | 1 | 0 |
| 1101 | X | 0 | 0 | 0 | 0 | 0 | 0 | 1 |
| 1110 | X | 1 | 1 | 1 | 1 | 1 | 1 | 0 |
| 1111 | X | 1 | 1 | 1 | 1 | 1 | 1 | 0 |

| | INPUT VALUE |
|---|---|
| 1 | 10000 |
| 2 | 10001 |
| 3 | 10101 |
| 4 | 10010 |
| 5 | 10011 |

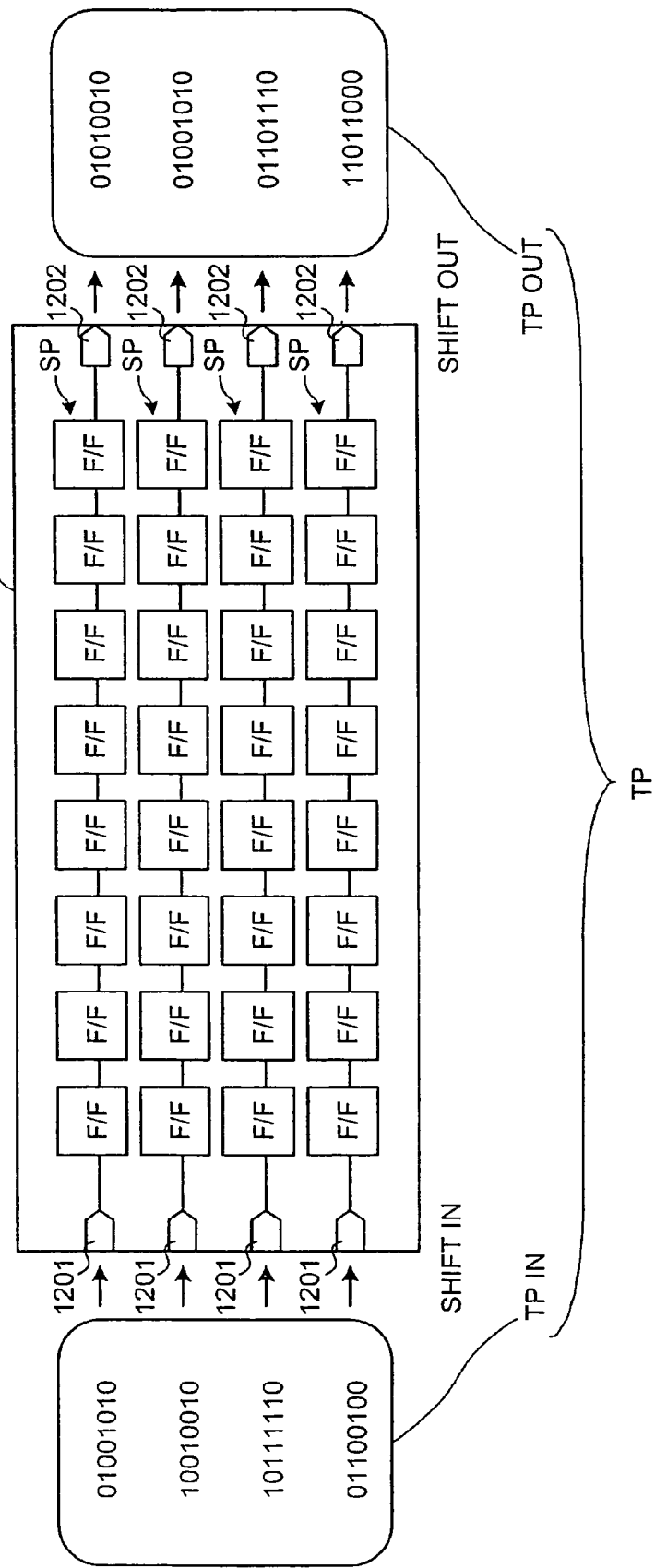

SEMICONDUCTOR INTEGRATED CIRCUIT, TEST DATA GENERATING DEVICE, LSI TEST DEVICE, AND COMPUTER PRODUCT

CROSS-REFERENCE TO RELATED APPLICATIONS

This application is based upon and claims the benefit of priority from the prior Japanese Patent Application No. 2006-128141, filed on May 2, 2006 and Japanese Patent Application No. 2007-065141, filed on Mar. 14, 2007, the entire contents of which are incorporated herein by reference.

BACKGROUND OF THE INVENTION

1. Field of the Invention

The present invention relates to a technology of testing a semiconductor integrated circuit.

2. Description of the Related Art

Conventionally, detection of a production defect of an integrated circuit is performed by inputting an appropriate signal value to an input pin of the integrated circuit using a tester such as automatic test equipment (ATE), and by comparing the signal value at the output pin with an expected value. The signal value of the input pin and the expected value of the output pin are collectively called a test pattern. When the integrated circuit includes sequential circuit elements (flip flop (F/F), latch and RAM), the complexity of preparing this test pattern increases remarkably. Therefore, scan design called deterministic stored pattern test (DSPT) is widely employed for the integrated circuit.

FIG. 12 is an explanatory diagram of a DSPT. In the DSPT, test patterns TP (input pattern TPin and output pattern TPout) generated by an automatic test pattern generator (ATPG) are stored into a tester (not shown).

A shift register is formed by sequential circuit elements (mainly F/F) in the integrated circuit 1200. This shift register is called a scan path SP. For convenience, four scan paths SP are formed in FIG. 12. A desired input pattern TPin is shifted in from the input pin 1201 at a test, and the value of the shift register is read from the output pin 1202 to the outside after clock impression. Thus, in the DSPT, setting and reading per test pattern TP are repeated to all the sequential circuit elements structuring the scan paths SP in the integrated circuit 1200.

Recently, along with the increased integration of the integrated circuit, the number of sequential circuit elements included in the inside thereof becomes extremely large. Therefore, the application of the DSPT mentioned above comes to be troublesome in the points of increased test time and test data amount. Therefore, a built-in self-test (BIST) comes to be performed.

FIG. 13 is an explanatory diagram of a BIST. In an integrated circuit 1300, a pseudo random number pattern generator 1301 is arranged at the input side of the scan path SP, and a signature analysis device 1302 is arranged at the output side. When a desired control signal is input to an input pin 1311, the pattern generated by the pseudo random number pattern generator 1301 is output to the scan path SP of the integrated circuit 1300, and the output result from the scan path SP is verified by and stored in the signature analysis device 1302. The signature analysis device 1302 compresses and outputs the output result from the scan path SP to the output pin 1312. In other words, it is verified whether this output is identical to the expected value.

To the pseudo random number pattern generator 1301 and the signature analysis device 1302, a linear feedback shift register (LFSR) is frequently used. Since the signature analysis device 1302 compresses and stores the output result as signature, it is called a multiple input signature register (MISR). In the BIST, the pseudo random number pattern generator 1301 is included in the integrated circuit 1300. Accordingly, it is possible to generate quite a large number of test patterns in a short time, and to greatly reduce the test data amount to load to the tester for compressing the test result by the signature analysis device (MISR) 1302.

The MISR is used for compressing the output data in the BIST. Once a value indicating an unknown state (hereinafter, "unknown value") is taken in, all the registers in the MISR become unknown state, and test cannot be performed. In general, the sequential circuit elements including RAM in the integrated circuit are in unknown state when power is turned on. The process of automatic test pattern generator (ATPG) is simplified by handling the output of the circuit portion that cannot be tested as unknown value. Therefore, it is necessary to handle unknown state. Furthermore, there are cases when it is necessary to cope with unknown values output according to a large amount of unknown states.

Furthermore, along with the increase of the circuit scale of the integrated circuit, the increase of test time and test data amount comes to be problems. As a test data amount reduction technology in combination of DSPT and BIST to cope with the problems, for example bist aided scan test) (BAST) technology is proposed (for example, Japanese Patent Application Laid-Open No. 2002-236144).

FIG. 14 is an explanatory diagram of the BAST (technology). In the BAST, the integrated circuit 1400 having scan paths SP includes the pseudo random number pattern generator 1301 and the signature analysis device 1302 used in the BIST. The pattern correcting device 1401 corrects the signal of the pseudo random number pattern generator 1301 using the external input. The unknown value mask device 1402 masks the unknown value to be output to the signature analysis device 1302. Thus, the same quality as that of the DSPT is maintained, and the test data and test time are greatly reduced by the DSPT.

However, along with miniaturization of an integrated circuit, new kinds of tests are added to cope with new fault mode, recently. Therefore, it is necessary to further compress test data.

FIG. 15 is an explanatory diagram of a control example of a pattern correcting device in the conventional BAST. In the integrated circuit 1500 in FIG. 15, test pattern is corrected by the input correcting circuit 1501 so that the test pattern generated by PRPG becomes the test pattern generated by ATPG. When the test pattern (PRPG) is corrected by the input correcting circuit 1501, the control signal designating address corresponding to the correction portion of the scan path is input from a tester.

For example, the integrated circuit 1500 has 16 scan paths, and 4-bit signal is required to designate the correction portion of the scan path. Furthermore, 4-bit signal is required for each correction portion, and 8 bits are necessary when there are 2 correction portions. Since the control signal includes information indicating contents of the control besides address information, more number of bits is required. Above control signal is generated as test data in the BAST, the test data amount increases in proportion with the number of correction portions.

SUMMARY OF THE INVENTION

It is an object of the present invention to at least solve the problems in the conventional technology.

A semiconductor integrated circuit according to an aspect of the present invention includes a generator that generates a random test pattern, plural shift registers that are specified by address bits and receive plural values included in the random test pattern, respectively, and a correcting device that corrects, based on a first signal specifying first shift registers having same upper bits of the address bits, values to be input to the first registers. The correcting device releases, when a value to be input to a second shift register that is one of the first shift registers is inappropriately corrected, correction of the value based on a second signal specifying the second shift register.

A semiconductor integrated circuit according to another aspect of the present invention includes a generator that generates a random test pattern, plural shift registers that are specified by address bits and receive plural values included in the random test pattern, respectively, and a mask device that masks, based on a first signal specifying first shift registers having same upper bits of the address bits, values to be input to the first registers. The mask device releases, when a fault value to be input to a second shift register that is one of the first shift registers is masked, a mask of the fault value based on a second signal specifying the second shift register.

A test-data generating device according to still another aspect of the present invention generates test data using design data of a semiconductor integrated circuit that includes a generator that generates a random test pattern, plural shift registers that are respectively specified by address bits and receive the random test pattern, and a correcting device that corrects a value of the random test pattern according to a control signal input from outside. The test-data generating device includes a first generating unit that generates a test pattern for a test, a comparing unit that compares the test pattern and the random test pattern, a second generating unit that generates a first signal and a second signal, the first signal specifying first shift registers having same upper bits of address bits based on a result of comparison performed by the comparing unit, the second signal specifying, among the first shift registers, a second shift register to be subjected to a release of correction, and a storing unit that stores the first signal and the second signal as test data at timing of a pattern shift of the test pattern.

A test-data generating device according to still another aspect of the present invention generates test data using design data of a semiconductor integrated circuit that includes a generator that generates a random test pattern, plural shift registers that are respectively specified by address bits and receive the random test pattern, and a mask device that masks unknown values output from the shift registers according to a control signal input from outside. The test-data generating device includes a specifying unit that specifies an address bit of a shift register that outputs an unknown value, a generating unit that generates a first signal and a second signal, the first signal specifying first shift registers having same upper bits of address bits as the address bit specified, the second signal specifying, among the first shift registers, a second shift register that outputs a fault value, and causing the mask device to release a mask of the fault value, and a storing unit that stores the first signal and the second signal as test data at timing of a pattern shift of the test pattern.

A test device according to still another aspect of the present invention performs a fault test on a semiconductor integrated circuit using test data generated by a test-data generating device. The semiconductor integrated circuit includes a generator that generates a random test pattern, plural shift registers that are respectively specified by address bits and receive the random test pattern, and a correcting device that corrects a value of the random test pattern according to a control signal input from outside. The test-data generating device includes a first generating unit that generates a test pattern for a test, a comparing unit that compares the test pattern and the random test pattern, a second generating unit that generates a first signal and a second signal, the first signal specifying first shift registers having same upper bits of address bits based on a result of comparison performed by the comparing unit, the second signal specifying, among the first shift registers, a second shift register to be subjected to a release of correction, and a storing unit that stores the first signal and the second signal as test data at timing of a pattern shift of the test pattern. The test device includes a control unit that reads the first signal and the second signal from the storing unit to output to the correcting unit, and a detecting unit that detects a fault of the semiconductor integrated circuit by comparing an output value output from the shift registers and an expected value of the test data.

A test device according to still another aspect of the present invention performs a fault test on a semiconductor integrated circuit using test data generated by a test-data generating device. The semiconductor integrated circuit includes a generator that generates a random test pattern, plural shift registers that are respectively specified by address bits and receive the random test pattern, and a mask device that masks unknown values output from the shift registers according to a control signal input from outside, and a verification unit that verifies a pattern output from the mask device. The test-data generating device includes a specifying unit that specifies an address bit of a shift register that outputs an unknown value, a generating unit that generates a first signal and a second signal, the first signal specifying first shift registers having same upper bits of address bits as the address bit specified, the second signal specifying, among the first shift registers, a second shift register that outputs a fault value and causing the mask device to release a mask of the fault value, and a storing unit that stores the first signal and the second signal as test data at timing of a pattern shift of the test pattern. The test device includes a control unit that reads the first signal and the second signal from the storing unit to output to the mask device, and a detecting unit that detects a fault of the semiconductor integrated circuit by comparing an output value output from the verification unit and an expected value of the test data.

BRIEF DESCRIPTION OF THE DRAWINGS

FIG. 1B is a sequence diagram of procedures of an LSI test performed by an LSI test system;

FIG. 7 is an explanatory diagram of a structure example of a control signal;

FIG. 8 is an explanatory diagram of a structure of an input value of test data of BAST;

FIG. 9A is a diagram of an example of a pattern correction of BAST;

FIG. 9B is an explanatory diagram of a control signal for pattern correction of BAST;

FIG. 10 is an explanatory diagram of an input value of test data of LSI test according to an embodiment;

FIG. 11A is a diagram of an LSI test pattern correction example according to the present embodiment;

FIG. 11B is an explanatory diagram of a control signal for pattern correction of LSI test;

FIG. 12 is an explanatory diagram of a DSPT;

DETAILED DESCRIPTION OF THE PREFERRED EMBODIMENTS

Exemplary embodiments according to the present invention will be explained in details with reference to the accompanying drawings.

Figure 1A:
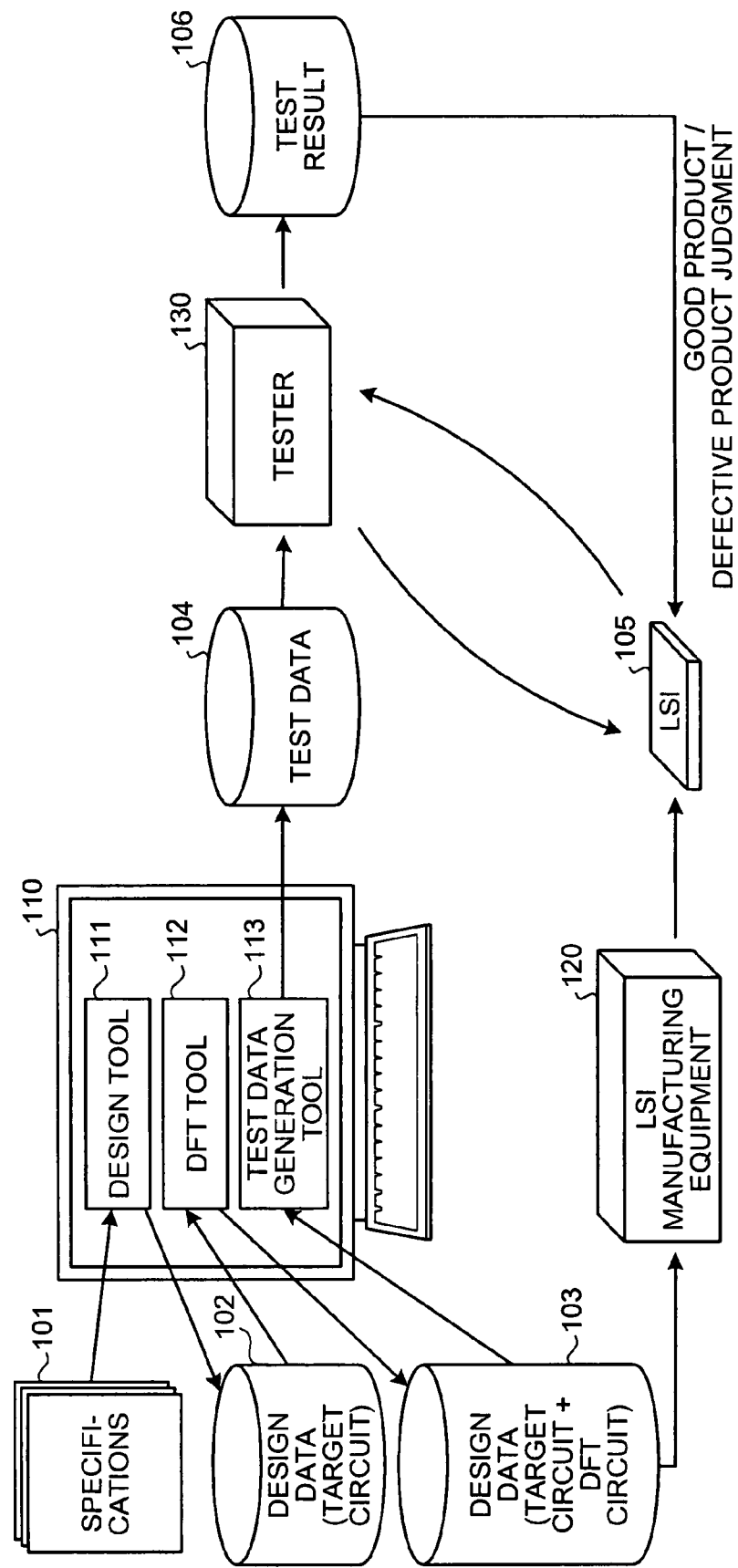
FIG. 1A is a schematic diagram of an LSI test system according to the present invention.

FIG. 1A is a schematic diagram of the LSI test system according to the present invention. An LSI test system 100 is a system that performs a test for detecting a defective product in an LSI 105 manufactured based on a specified specification 101. The LSI test system 100 includes an information processor 110, an LSI manufacturing equipment 120, and a tester 130. In the LSI test system 100, the LSI 105 is tested through three processes of design, manufacture, and test, using the above respective apparatuses.

The information processor 110 runs software for an LSI manufacture and an LSI test, and generates an LSI manufacture data and an LSI test data. In other words, the information processor 110 performs a design process in the LSI test system 100. More specifically, the information processor 100 includes a design tool 111 and a DFT tool 112 as LSI manufacture software, and a test data generation tool 113 as LSI test software.

The design tool 111 generates a design data 102 for manufacturing an LSI to meet requirements set in the specifications 101. The design data 102 is the design data of the LSI that performs the process to meet requirements set in the specifications 101. In the LSI test, the LSI that does not operate normally is detected as a defective product. The design data 102 is especially called the design data of a "target circuit".

The DFT tool 112 generates, from the design data 102, a design data 103 of the LSI further including a DFT circuit. The DFT circuit is the circuit to be added for improving the test efficiency of the target circuit. More specifically, the DFT circuit includes a process circuit for inputting a test input value to the target circuit, and a process circuit for verifying the output result that is output from the target circuit.

In the case of the LSI test system 100, as the DFT circuit of LSI, a pattern generator that automatically generates an input value (test pattern) to the shift register as the target circuit, a pattern correcting device that corrects the pattern generated by the pattern generator into the test pattern for the LSI test, an MISR that compresses an output value from the shift register, and an unknown value mask device that prevents an unknown value from being input to the MISR are arranged (details of the DFT circuit are described later). Thus, the DFT tool 112 designs LSI in which the DFT circuit is arranged on the target circuit. Accordingly, the design data 103 generated by the DFT tool 112 is referred to as the design data especially of "target circuit+DFT circuit".

The test data generation tool 113 generates, from the design data, test data 104 to be used for the LSI test 103. In the test data generation tool 113, the input/output simulation of the target circuit+DFT circuit is carried out. From this simulation result, the test data 104 used for the test of the LSI manufactured by the design data 103 is generated.

In the LSI test system 100 according to the present invention, as mentioned above, the DFT circuit includes the pattern generator that generates test patterns automatically. The pattern correcting device corrects the test pattern generated by the pattern generator into the test pattern for the LSI test generated by an automatic test pattern generator (ATPG) included in the test data generation tool 113. Furthermore, when the unknown value is output from the shift register to which the test pattern corrected by the pattern correcting device is input, the unknown value is masked by the unknown value mask device so as not to be input to the MISR. At the correction by the pattern correcting device and at masking by the unknown value mask device, a pattern shift is not carried out, and the pattern shift is carried out after they are completed. Accordingly, the test data 104 includes a control signal to control the pattern correcting device at each pattern shift of test pattern and to obtain the output value suitable for the LSI test, a control signal to control the unknown value mask device, a control signal for the pattern shift, and the output expected value to be compared with an output value output from the LSI 105.

An LSI manufacturing equipment 120 manufactures the LSI 105 from the design data (target circuit+DFT circuit) 103 generated by the DFT tool 112. In other words, the LSI manufacturing equipment 120 carries out the manufacture process in the LSI test system 100. As mentioned in the explanation of the DFT tool 112, the design data 103 is the design data for manufacturing the LSI including the target circuit and the DFT circuit for testing the target circuit. Accordingly, the LSI 105 manufactured by the LSI manufacturing equipment 120 includes the target circuit and the DFT circuit. In the circuit simulation carried out by the above test data generation tool 113, the process of the LSI 105 is carried out virtually on software.

The test data 104 generated by the test data generation tool 113 is stored in the tester 130. The tester 130 refers to the stored test data 104, and performs the defect test of the LSI 105. In other words, the tester 130 carries out the test process in the LSI test system 100.

More specifically, the tester 130 refers to the test data 104, and inputs the pattern shift instruction of the test pattern to be generated by the pattern generator of the LSI 105, and the control signals to control the pattern correcting device and the unknown value mask device according to the test pattern. In the LSI 105, the test pattern input from the pattern generator is corrected by the pattern correcting device and input to the shift registers, and the output value masked by the unknown value mask device are compressed by the MISR and output to the tester 130 as an output value. The tester 130 judges whether the LSI 105 is good or defective using the test result 106 obtained by comparing the output value from the LSI 105 and the output expected value of the test data 104.

FIG. 1B is a sequence diagram of the procedure of the LSI test by the LSI test system. When obtaining the design data (target circuit+DFT circuit) 103 (step S201), the test data generation tool 113 of the information processor 110 executes the circuit simulation based on the design data 103 (step S202), and generates the test data 104 from the simulation at the step S202 (step S203).

The tester 130 performs the test of the LSI 105 using the test data 104. The test data generated by the test data generation tool 113 is read out (step S204). Then, the tester refers to the test data 104, and instructs the pattern shift to the random number generator of the LSI 105, and outputs a control signal according to the test pattern to the pattern correcting device and the unknown value mask device (step S205).

The pattern shift instruction and the control signal are input to the LSI 105 as the input values from the tester 130. In response to these input values, the pattern generator of the LSI 105 inputs the test pattern to the target circuit (shift register), and controls the unknown value mask device using the control signal (step S206). In the LSI 105, the value according to the test pattern by the process at the step S205 is output, and this output value is compressed (step S207). The compressed output value is read to the tester 130.

The tester 130 reads out the output value from the LSI 105, and compares the output value with the output expected value included in the test data 106, and performs the defective product detection (step S208), and the series of LSI test procedures end.

The LSI test system 100 according to the present invention performs the test on the LSI 105 according to the procedures explained above. Accordingly, the information processor 110 that generates the test data 104 by the test data generation tool 113 functions as a test data generator, and the tester 130 that performs the test on the LSI 105 using the generated test data 104 functions as the LSI test device. The tester 130 is not limited to exclusive hardware, but may be realized as an information processor storing therein an exclusive tool that carries out the process performed by the tester 130.

The requirements for the LSI test and the DFT circuit will be explained. In the conventional BAST technology, one code is required to set one F/F in the pattern correcting device or the unknown value mask device and to perform the correction process or the mask process. When many corrections are necessary, the number of codes becomes large and the compression ratio of entire test data cannot be increased. In the present invention, plural F/Fs in the pattern correcting device is set by one code. Therefore, the number of codes can be reduced.

Furthermore, since plural F/Fs are set at one time, a code shorter than [log$_2$N] may be used by dividing N scan paths into some groups. Note that [log$_2$N] is the smallest integer that is not smaller than the number of bits x for indicating addresses of N scan paths. However, the same setting is not always required to plural F/Fs by the group division.

Adding a code to reset only the setting of a certain F/F after setting plural F/Fs per group gives flexibility. Codes (control signals) that make test data small can be generated by combining the above codes according to the target correction pattern.

When the signature analysis device (especially the MISR) is used, it is important to prevent the unknown value from being input to the MISR, and it is necessary to cope with many unknown states in some structure of integrated circuit. When many unknown states are handled in BAST, the compression ratio thereof becomes extremely deteriorated. Accordingly, in the present invention, the LSI test should be performed using the technology to securely mask the unknown value with small data amount without deteriorating the compression ratio in many unknown states.

Figure 2:
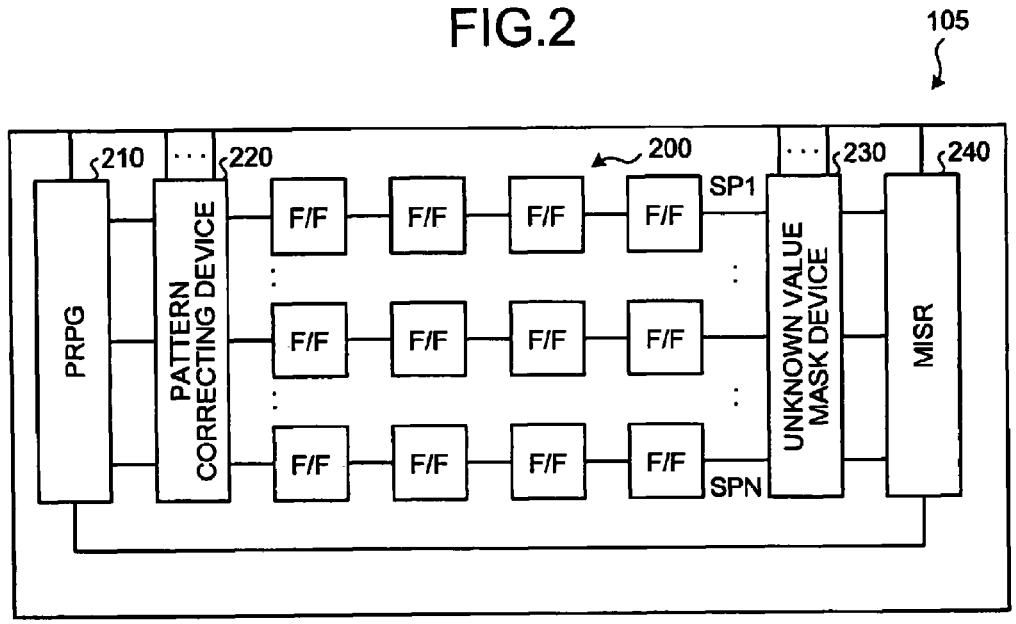
FIG. 2 is a block diagram of a structure of an LSI including a design for test (DFT) circuit.

FIG. 2 is a block diagram of the structure of the LSI including the DFT circuit. The LSI 105 includes a shift register such as scan path (SP) 200 corresponding to a target circuit, a pattern generator (PRPG) 210 corresponding to a DFT circuit, a pattern correcting device 220, an unknown value mask device 230, and an MISR 240.

In the DFT circuit included in the LSI 105, the PRPG 210 generates a random test pattern according to the pattern shift of the test data input from the outside (for example, the tester 130) as trigger. The pattern correcting device 220 corrects the test pattern generated by the PRPG 210 into the test pattern for LSI test to be output to the shift register 200. The correction performed by the pattern correcting device 220 is inversion process of changing the test pattern from "0"s to "1" or from "1" to "0".

The unknown value mask device 220 masks the output of the scan paths specified as mask targets among the output from the shift register 200. The MISR 240 compresses the output value output from the shift register 200 and outputs the compressed value to the tester 130 shown in FIG. 1. Not the output value that passes the shift register but a fixed value (for example, "1") is output from the shift register 200 that becomes a mask target.

Figure 3A:
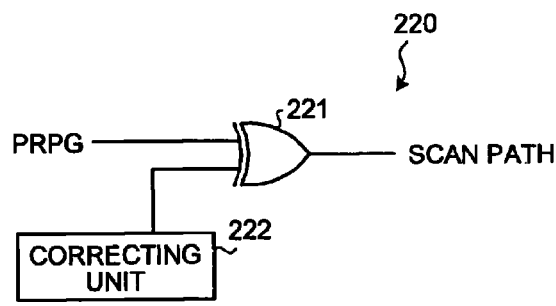
FIG. 3A is a circuit diagram of a structure of a pattern correcting device.

FIG. 3A is a circuit diagram of the structure of the pattern correcting device. The pattern correcting device 220 includes an EXOR 221 and a correcting unit 222. A random test pattern output from the PRPG 210 is input to the EXOR 221. The output value output from the correcting unit 222 is input to the EXOR 221. In the state when the control signal is not input from the tester 130, in other words, when it is not corrected, "0" is output from the correcting unit 222. Accordingly, in the state when the control signal is not input, the EXOR 221 outputs the test pattern input from the PRPG 210 to the shift register (scan path) 200 as it is.

When the correction instruction (set) is input from the outside using the control signal, the correcting unit 221 outputs "1". When "1" is input from the correcting unit 221, the EXOR 221 outputs the inverted value of the test pattern input from the PRPG 210. More specifically, when the test pattern output from the PRPG 210 is "0", the EXOR 221 outputs the inverted value "1", and when the test pattern output from the PRPG 210 is "1", the EXOR 221 outputs the inverted value "0".

In the present embodiment, the above inversion process of the test pattern is referred to as the correction of the test pattern. The control signal to instruct the correction to the correcting unit 222 is stored in a predetermined recording medium as one of the test data 104 generated by the test data generation tool 113 explained in FIG. 1A and FIG. 1B. Accordingly, when the LSI 105 is tested by the tester 130, the control signal is read out from the test data 104 appropriately according to the pattern shift, and output to the pattern correcting device 220.

Furthermore, the control signal instructs a correction release instruction (reset) besides the correction instruction (set). When the correction release instruction is input to the pattern correcting device 220 as the control signal, the correcting unit 222 outputs "0". Accordingly, after the correction release instruction, the pattern correcting device 220 outputs the value input from the PRPG 210 to the shift register (scan path) 200 as it is.

Figure 3B:
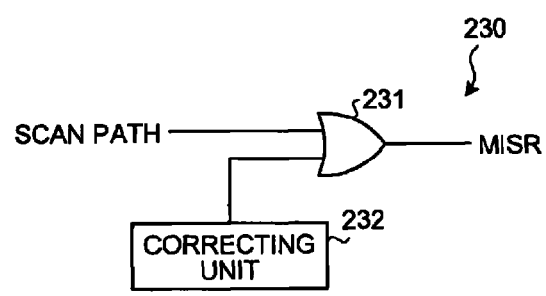
FIG. 3B is a circuit diagram of an unknown value mask device.

FIG. 3B is a circuit diagram of the structure of the unknown value mask device. The unknown value mask device 230 includes an OR circuit 231 and a correcting unit 232. The value output from the shift register (scan path) 200 and the value output from the correcting unit 232 are input to the OR circuit 231. The value output from the OR circuit 231 is input to the MISR 240 as the value output from the unknown value mask device 230.

The correcting unit 232 in the unknown value mask device 230 outputs "0" in normal operation. Accordingly, when "0" is output from the shift register (scan path) 200, "0" is output from the OR circuit 231. On the other hand, when "1" is output from the shift register (scan path) 200, "1" is output from the OR circuit 231. In other words, if the correcting unit 232 outputs "0", the value input from the shift register (scan path) 200 is output from the unknown value mask device 230 as it is.

When the control signal indicating the mask instruction (set) output from the outside (for example, the tester 130) is input to the correcting unit 232, the correcting unit 232 outputs "1" to the OR circuit 231. The OR circuit 231 to which "1" is input from the correcting unit 232 outputs the fixed value "1" irrespective of the input value from the shift register (scan path) 200. Accordingly, the value output from the shift register (scan path) 200 is masked, and is not output to the MISR 240.

In the same manner as the pattern correcting device 220, the control signal includes the correction release instruction (reset) besides the correction instruction (set). When the correction release instruction is input to the unknown value mask device 230 as the control signal, the correcting unit 232 outputs "0". Accordingly, after the correction release instruction, the unknown value mask device 230 outputs the value output from the shift register (scan path) 200 to the MISR 240 as it is.

According to the embodiment of the present invention, as explained above, the LSI test is performed for the LSI 105 having a DFT circuit including PRPG 210, the pattern correcting device 220, the unknown value mask device 230, and the MISR 240, and the target circuit including shift register 200. Furthermore, the LSI 105 explained in FIGS. 2, 3A, and 3B is stored in a predetermined recording medium as the design data 103, as explained in FIG. 1. The design data 103 is used when the LSI 105 is manufactured by the LSI manufacturing equipment 120, and when a circuit simulation is performed for generating the test data 104 by the test data generation tool 113 in the information processor 110.

The procedure of generating test data will be explained. When the LSI test of the LSI 105 is performed, the test data generation tool 113 is generated as explained by FIG. 1B. Hereinafter, the procedure of generating test data by the test data generation tool 113 will be explained.

In the test data generation tool 113, the LSI 105 is structured on software based on the design data 103, and a circuit simulation is performed. More specifically, the control signal for inputting the test pattern generated by ATPG to the pattern correcting device 220, and the control signal to cause the unknown value mask device 230 to mask the unknown value and to output the fault value are generated to the LSI 105 on software.

Figure 4:
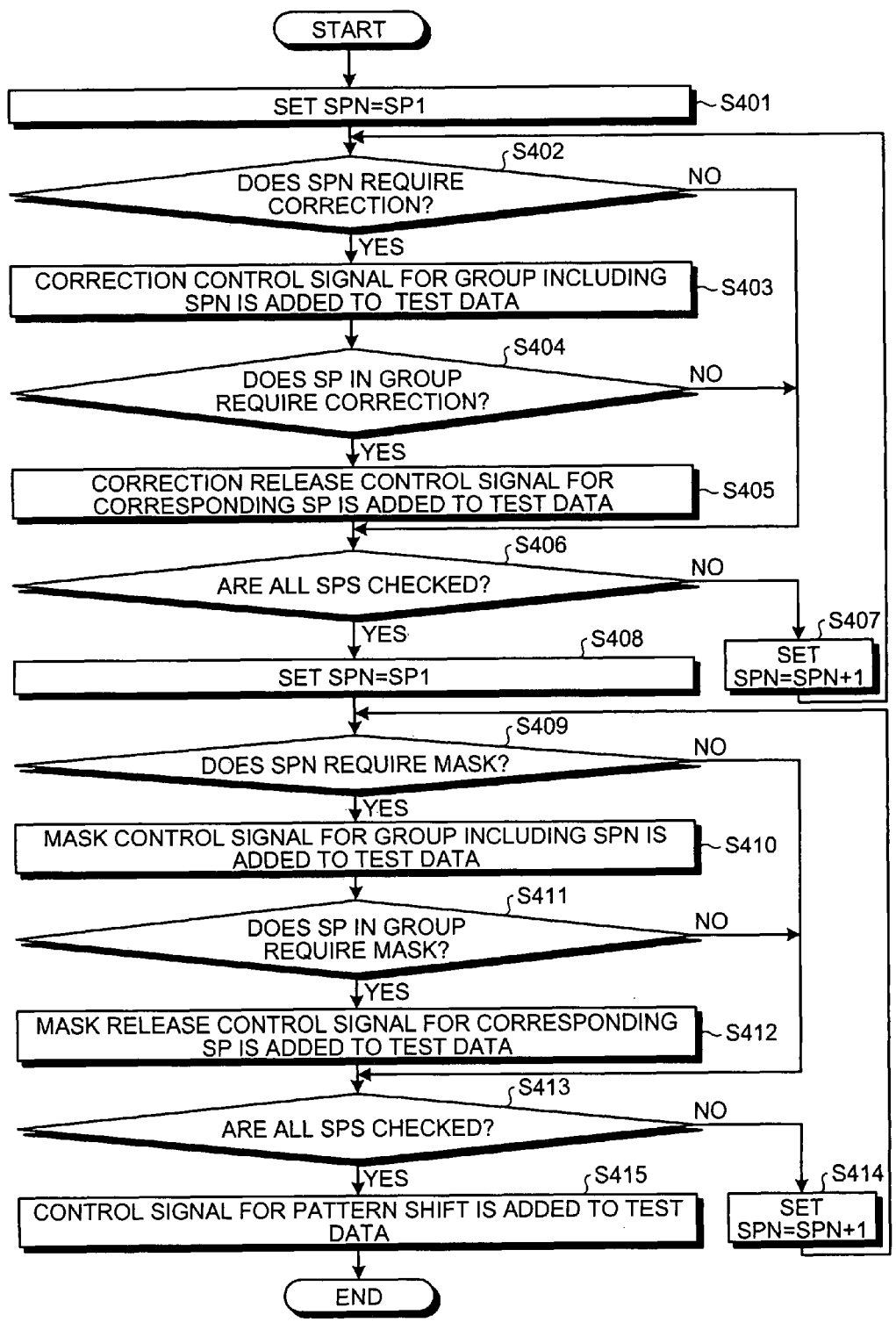
FIG. 4 is a flowchart of generating test data.

FIG. 4 is a flowchart of generating test data. The scan path SPN to be the check target from the shift register 200 is set to SP1 (step S401). It is judged whether the scan path SPN requires correction or not (step S402). When correction is required is the case when the test pattern to be input to the scan path SPN (a random test pattern generated by the PRPG 210) is different from the test pattern for the test generated by the ATPG. Even when a test pattern different from the test pattern generated by ATPG is input to the scan path SPN, if the test pattern for the test generated by ATPG is an unknown value, the random test pattern is not corrected (step S402: NO), and input to the scan path SPN as it is.

At the step S402, when the scan path SPN requires correction (step S402: YES), the correction (set) control signal for the group including the scan path SPN is added to the test data (step S403). The group including the scan path SPN is the group of the scan path SP specified by same upper bit, among the address bits for specifying respective scan path structuring the shift register 200. When the scan path SPN does not require correction (step S402: NO), the procedure shifts to the process at step S406.

It is judged whether the scan path SP in the group of the scan path SPN requires correction (step S404). The scan path SP that requires correction at step S404 is the scan path SP where the input test pattern is corrected by the correction control signal added at the step S403 and the test pattern becomes different from that generated by ATPG.

When the scan path SP in the group requires correction (step S404: YES), the correction release (reset) control signal for the corresponding scan path SP is added to the test data (step S405), and the procedure shifts to the process at the step S406. When the scan path SP in the group does not require correction (step S404: NO), the procedure shifts to the process at the step S406.

It is judged whether all the scan paths SP are checked (step S406). When the check of all the scan paths SP is not completed (step S406: NO), the value of the scan path SPN of the check target is incremented by one (step S407), and the procedure goes back to the process of the step S402, and the processes from the steps S402 to S406 are repeated until the check of all the scan paths SP is completed.

The processes from the steps S401 to S407 explained above are the process to generate the control signal of the pattern correcting device 220 among test data. When the check of all the scan paths SP is completed (step S406: YES), the procedure shifts to the process at step S408.

Then, the procedure shifts to the process to generate the control signal for the unknown value mask device 230 among test data. The scan path SPN to be the check target is set to SP1 again (step S408). It is judged whether the scan path SPN requires mask (step S409). The scan path SP that requires mask is the scan path SP that outputs an unknown value.

When the scan path SPN requires mask (step S409: YES), the mask (set) control signal for the group including the scan path SPN is added to the test data (step S410). The group at step S410 is, as mentioned above, the scan path where the upper bit of the address bit is common. When the scan path SPN does not require mask (step S409: NO), and the procedure shifts to the process at step S413.

It is judged whether the scan path SP in the group of the scan path SPN requires mask (step S411). The scan path SP that does not require mask is the scan path SP that outputs a fault value.

When the scan path SP in the group does not require mask (step S411: YES), the mask release (reset) control signal for the corresponding scan path SP is added to the test data (step S412), and the procedure shifts to the process at step S413. When the scan path SP in the group requires mask (step S411: NO), the procedure shifts to the process at step S413.

It is judged whether all the scan paths SP are checked (step S413). When the check of all the scan paths SP is not completed (step S413: NO), the value of the scan path SPN is incremented by one (step S414), and the procedure goes back to the process at step S409, and the processes from steps S409 to S434 are repeated until the check of all the scan paths SP is completed. The processes at steps S409 to S434 explained above are the process to generate the control signal for the unknown value mask device 230 among the test data.

When it is judged that the check of all the scan paths SP is completed (step S413: YES), the control signal for the pattern shift is added to the test data (step S415), and the series of processes end. Then, the test data 104 to which all of the control signals added to the test data at steps S403, S405, S410, S412, and S415 are added is stored into the recording medium.

Figure 5:
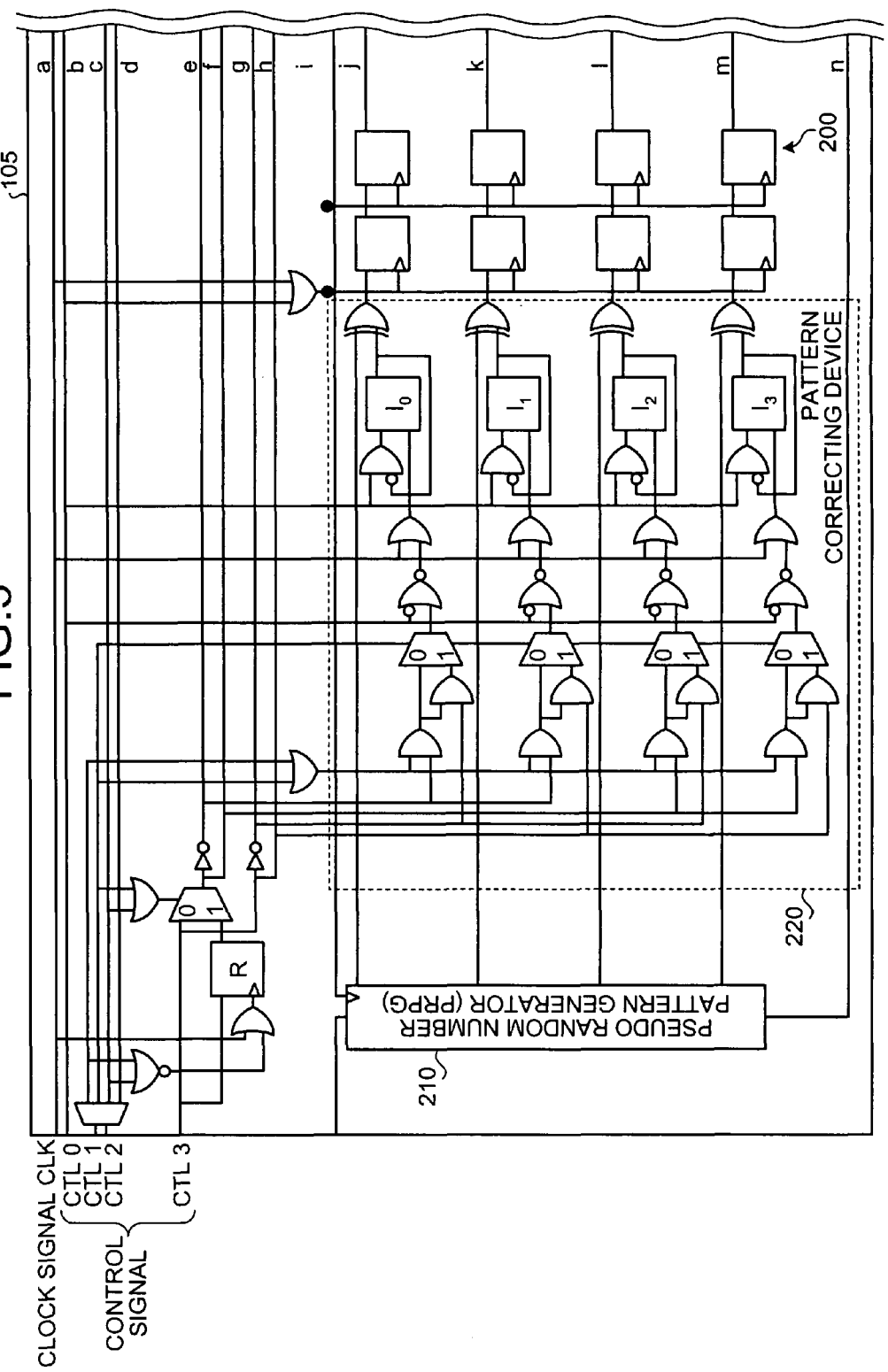
FIG. 5 is a circuit diagram of an embodiment of a pattern correcting device.

FIG. 5 is a circuit diagram of a package example of the pattern correcting device. The pattern correcting device 220 corrects (or releases the correction) the random test patterns input to the shift register 200 having four scan paths based on the control signals CTL0 to CTL3.

Figure 6:
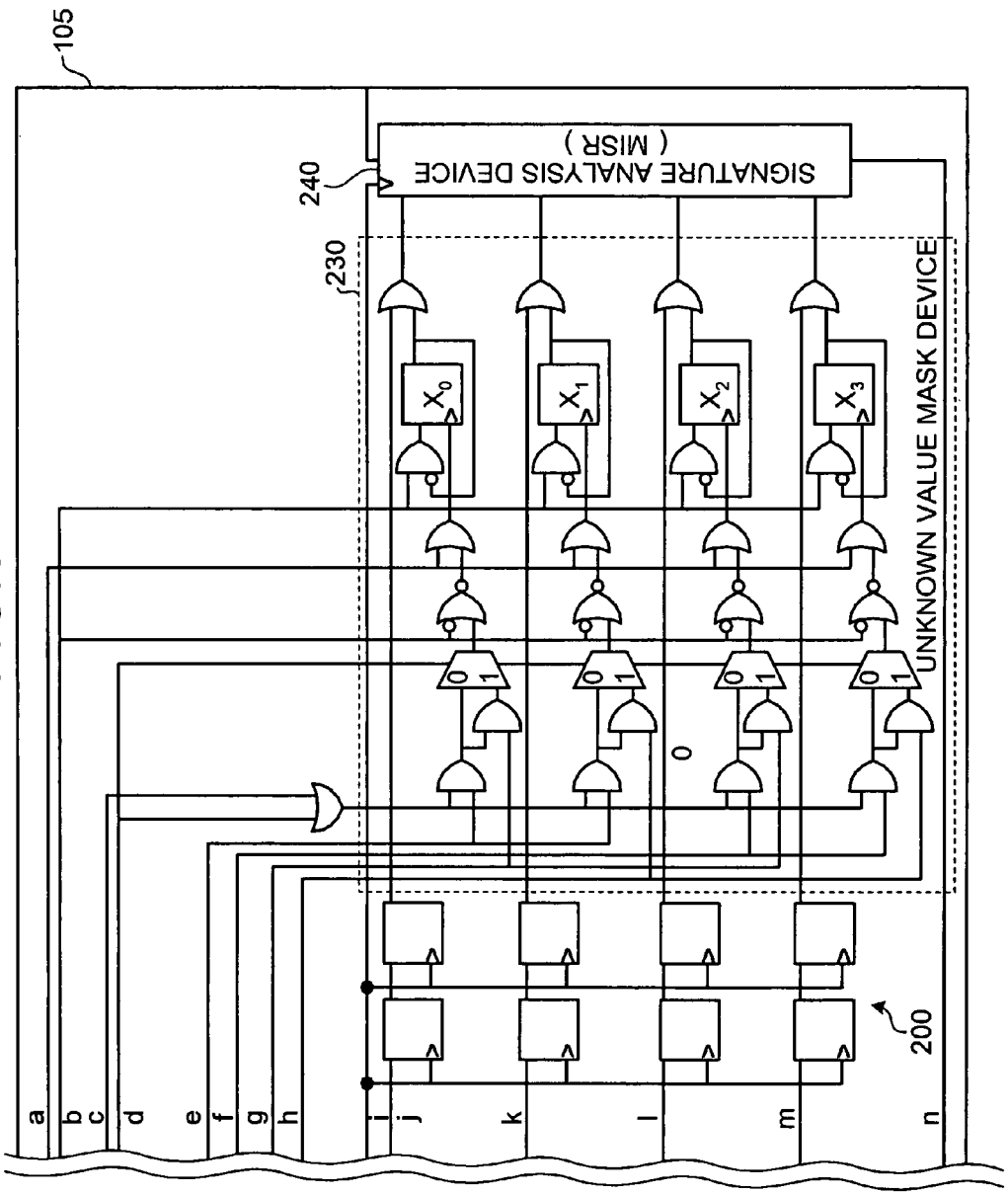
FIG. 6 is a circuit diagram of an embodiment of an unknown value mask device.
Figure 13:
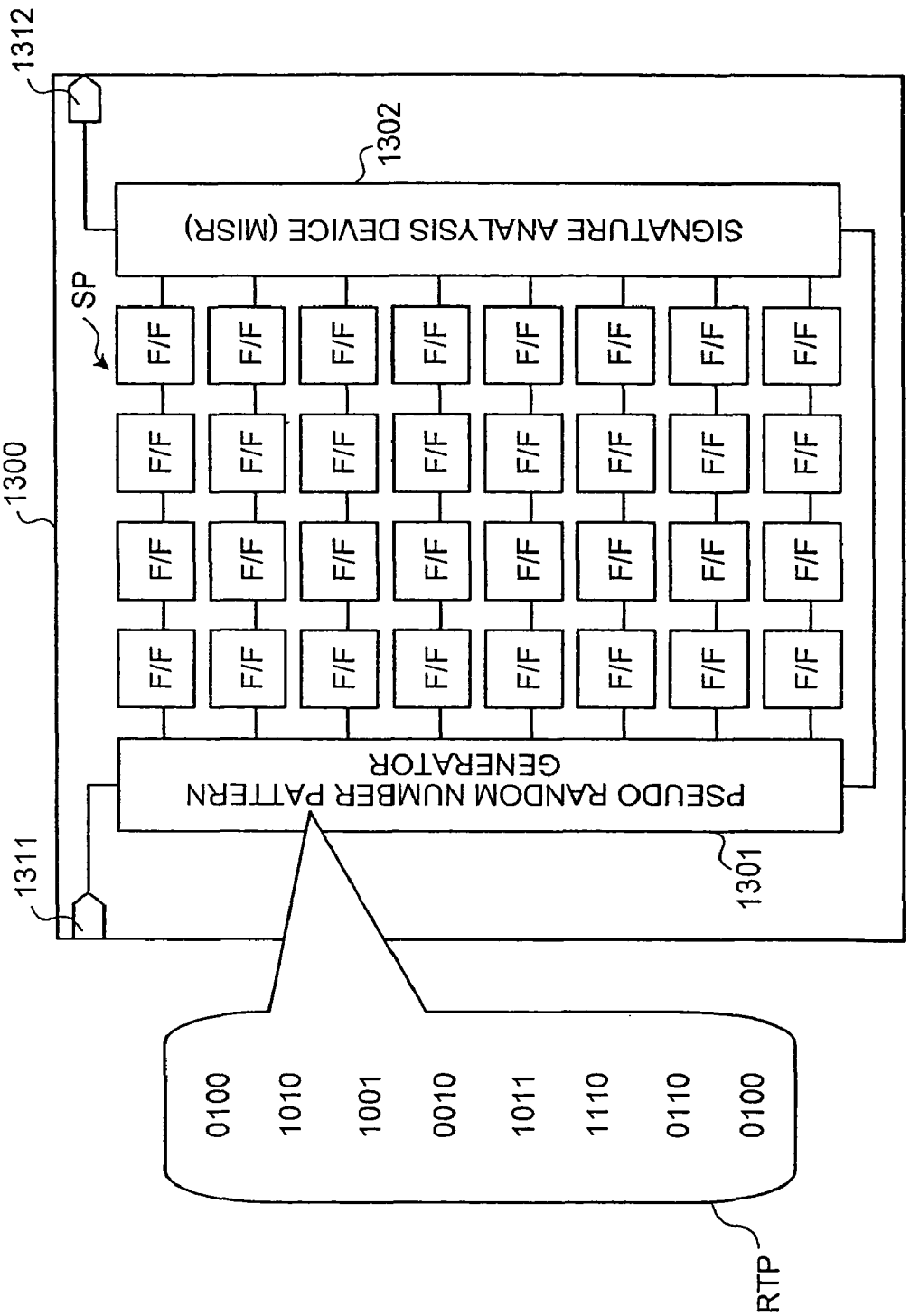
FIG. 13 is an explanatory diagram of a BIST.
Figure 14:
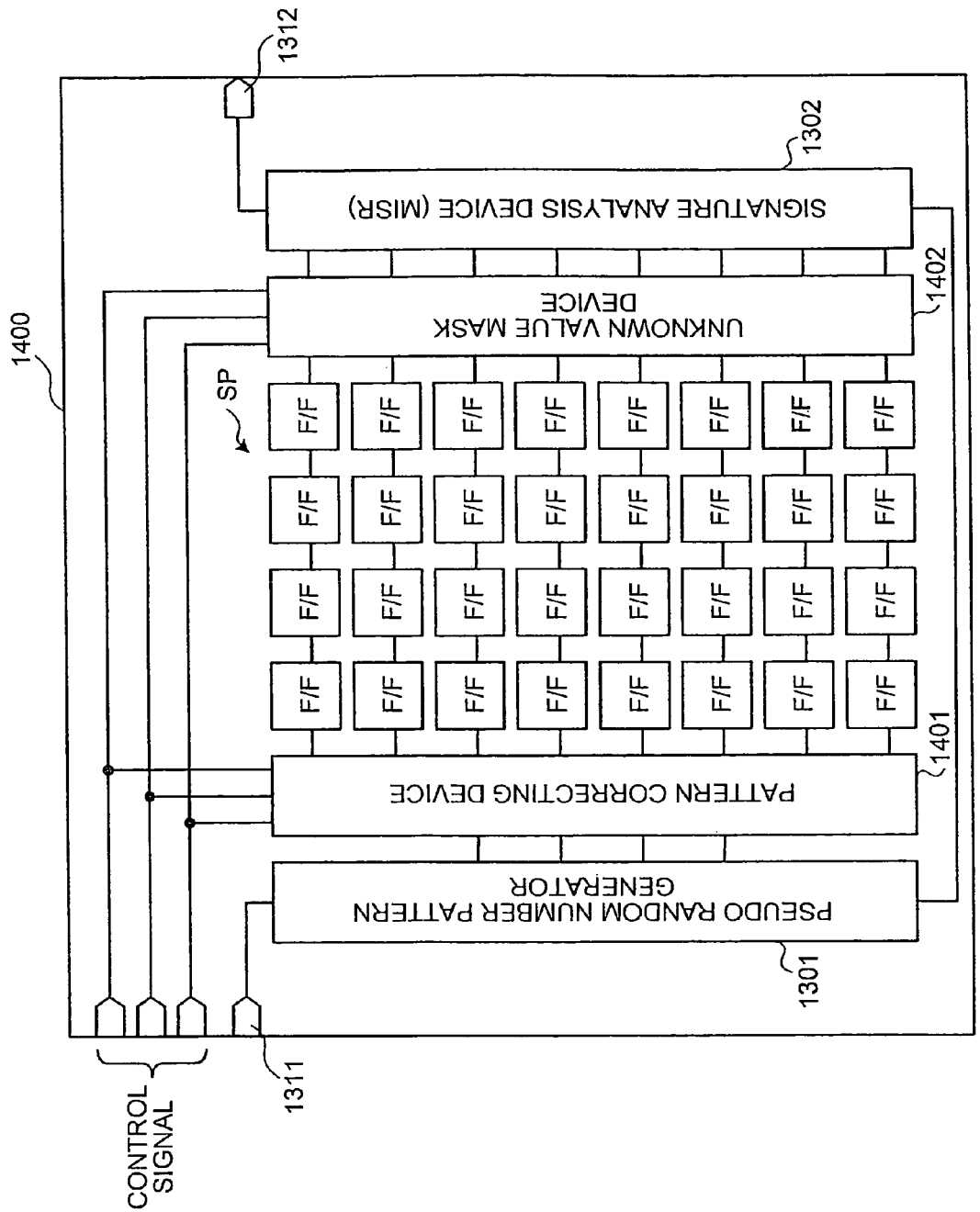
FIG. 14 is an explanatory diagram of the BAST (technology)
Figure 15:
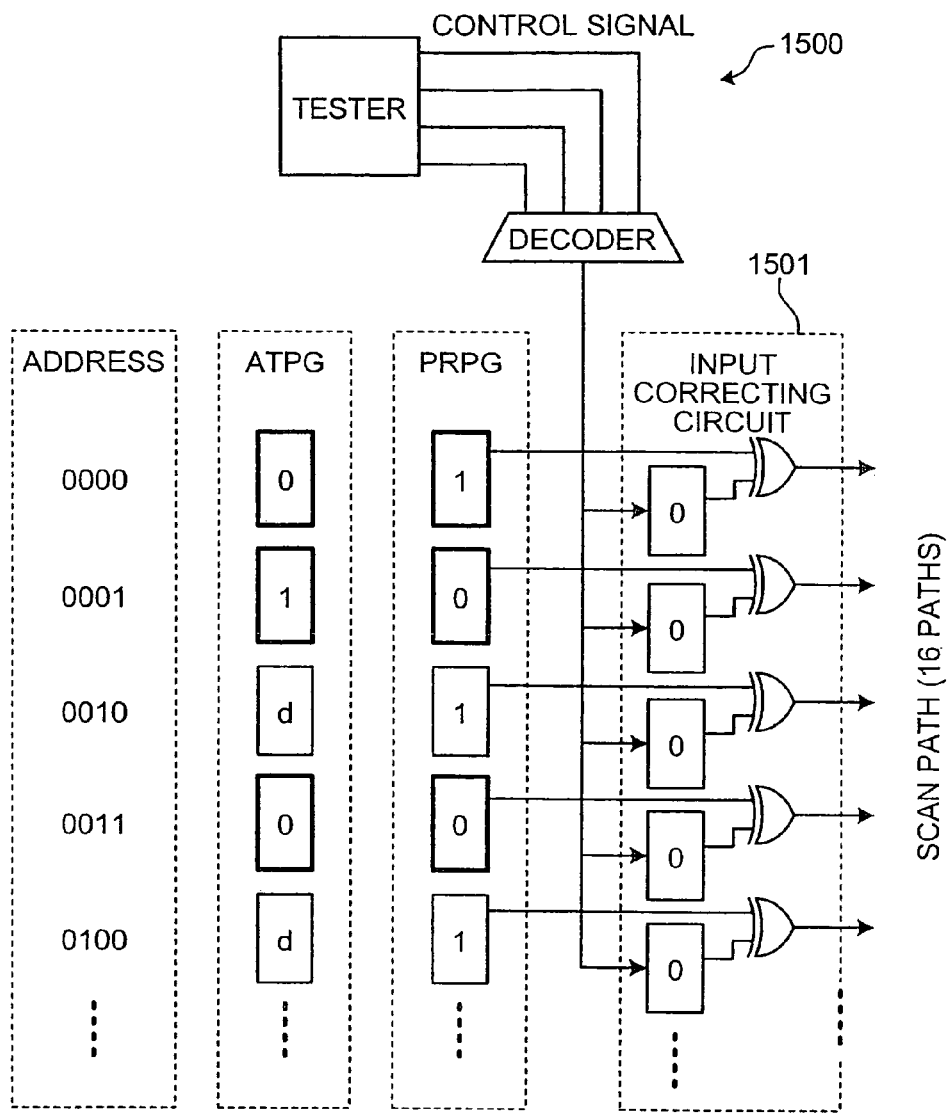
FIG. 15 is an explanatory diagram of an example of control of a pattern correcting device in the conventional BAST.

FIG. 6 is a circuit diagram of a package example of the unknown value mask device. Each process on the LSI 105 according to the control signal such as the correction process performed by the pattern correcting device 220 and the masking process performed by the unknown value mask device 230, is performed according to the clock signal as trigger.

FIG. 7 is an explanatory diagram of a structure example of the control signal. In the case of the shift register 200 including four scan paths, the control signal includes 4-bit signals CTL0 to CTL3.

Among the control signals CTL0 to CTL3, the bits of CTL0 to CTL2 indicate control information on control contents, and the bit of CTL3 indicates address information on the address of the scan path (SP) for correction and mask. The respective control signals indicate the following instructions.

CTL0: the test pattern shift instruction
  (If CTL0 is "0", the test pattern is shifted.)
CTL1: "0" indicates the control for the pattern correcting device 220 (inverting circuit), and "1" indicates the control for the unknown value mask device 230.
CTL2: "0" indicates set, and "1" indicates reset of each function portion (for example, F/F).
CTL3: address information
  (CTL3 indicates the upper bit or the lower bit according to the contents of CTL0 or CTL2)

Accordingly, the control signal can control the operations of the pattern correcting device 220 and the unknown value mask device 230 according to the test pattern input from the PRPG 210, by combinations of CTL0 to CTL3. Note that each package example of the pattern correcting device 220 and the unknown value mask device 230 explained above is only one example, and may be realized by a circuit having other structure.

The contents of the control by the control signal will be explained. Hereinafter, the case when the pattern correcting device 220 performs correction of the test pattern for the shift register 200 including 16 scan paths will be explained. To explain how much the data amount of test data is reduced when test pattern with the same condition is input, the control process performed by the pattern correcting device in the case when the LSI test is performed by BAST as the conventional art, and the correction process performed by the pattern correcting device 220 when the LSI test is performed by the present embodiment are compared.

FIG. 8 is an explanatory diagram of the structure of the input value of the test data of BAST. When the pattern correcting device is controlled by BAST, the input value of the test data includes the following three kinds of control signals.

A control signal 801 to instruct the pattern shift: 00xxxx
A control signal 802 to set the correcting unit of the pattern correcting device: 01xxxx
A control signal 803 to set the correcting unit of the unknown value mask device: 10xxxx In the above control signals, the lower four bits are address bits for specifying the scan path (SP) to become the control target among all the shift registers 200 in the LSI 105. Since the shift register 200 includes 16 scan paths as the example, four address bits are required for specifying the shift register 200. In the case of the control signal 801, the pattern shift of the test pattern is performed irrespective of address bits.

FIG. 9A is a diagram of the pattern correction example of BAST. As shown in 910 in FIG. 9A, when the test data for the LSI test generated by the ATPG of the tester 130, and the random test pattern generated by the PRPG 210 of the LSI 105 are compared, there are differences at 15 portions. The test pattern generated by ATPG from the 15 portions needs to correct 8 portions in total excluding 7 portions to which "x" is set.

FIG. 9B is an explanatory diagram of the control signal for pattern correction of BAST. To correct the above eight portions, eight control signals such as data string 920 are required as the input value to the LSI 105. When the control signals 1 to 8 are input in order, the pattern correcting device 220 corrects the input to the scan path of the address bit specified by the control signal (hatched portion shown in FIG. 910). Thus, in the pattern correction by BAST, eight 6-bit control signals are used. Accordingly, for the pattern correction, data of 6×8=48 bits in total are required.

FIG. 10 is an explanatory diagram of the structure of the input value of test data of the LSI test according to the present embodiment. When the pattern correcting device 220, the unknown value mask device 230 are controlled in the LSI test, the input value of test data includes the following five kinds of control signals.

A control signal 1001 to instruct the pattern shift: 0xxxx
A control signal 1002 to set the correction of the pattern correcting device: 100xx
A control signal 1003 to reset the correction of the pattern correcting device: 101yy
A control signal 1004 to set the mask of the unknown value mask device: 110xx
A control signal 1005 to reset the mask of the unknown value mask device: 111yy In the above control signals, the control signal 1001 performs the pattern shift of test pattern, if the most upper bit is "0", irrespective of other lower bits than the most upper bit "0". When the correction of the pattern correcting device 220 is set by the control signal 1002, the test pattern that is input to all the shift registers 200 where the lower bits "xx" of the control signal 1002 are common with the upper two bits of the address bit of the shift register 200 is corrected.

The control signal 1003 releases the correction to the test pattern that is input to the shift register 200 corresponding to inappropriate correction, when such an inappropriate correction as the test pattern of the PRPG 110 becomes different from the test pattern of ATPG is carried out. Accordingly, the lower two bits "yy" of the control signal 1003 indicates the remaining lower addresses for releasing the correction of the shift register 200 whose upper addresses are "xx" and individually specifying the shift register 200. In other words, the correction of the pattern correcting device 220 of the shift register 200 of bit address "xxyy" is reset individually by the control signal 1003.

The control signals 1004 and 1005 control the mask process performed by the unknown value mask device 230. The control signal 1004 masks the output of all shift registers 200 whose lower bits "xx" are in common with the lower two bits of the address bits by the unknown value mask device 230. Moreover, the control signal 1005 causes the unknown value mask device 230 to individually releases the mask of the shift register 200 whose fault value is masked by the control signal 1004. Accordingly, the lower two bits "yy" of the control signal 1005 indicates the remaining lower addresses for releasing the mask of the shift register 200 whose upper addresses are "xx" and individually specifying the shift register 200. In other words, by the control signal 1005, the mask by the unknown value mask device 230 to the shift register 200 of bit address "xxyy" is reset individually.

FIG. 11A is a diagram of an example of the LSI test pattern correction. FIG. 11B is an explanatory diagram of the control signal for the LSI test pattern correction. As shown 110 in FIG. 11A, when the test data for the LSI test generated by ATPG of the tester 130, and the random test pattern generated by the PRPG 210 of the LSI 105 are compared, it is necessary to correct 8 portions excluding the portions indicating the unknown value. Accordingly, the pattern correcting device 220 is controlled using the control signal of the data string 1120 in FIG. 11B.

All the inputs to the scan paths where the upper two bits of address bits are "00" are corrected by the control signal 1 "10000". Then, since there is not any appropriate correction, all the inputs to the scan paths where the upper two bits of address bits are "01" are corrected by the control signal 2 "10001". Since the input to the scan path of address bit "0101" is different from ATPG and inappropriate, the correction to the input to the scan path of address bit "0101" is released by the control signal 3 "10101".

In the same manner, all the inputs to the scan paths where the upper two bits of address bits are "10" are corrected using the control signal 4, and all the inputs to the scan paths where the upper two bits of address bits are "11" are corrected using the control signal 5. Since there is not any inappropriate correction in the correction using the control signals 4 and 5, five 5-bit control signals are used in the pattern correction according to the present embodiment. Accordingly, data of 5×5=25 bits in total are required for the pattern correction.

According to the present embodiment, it is possible to greatly reduce the data mount of control signals using the control signals to control the correction in unit of predetermined group and individual correction release. The reduction amount becomes greater according to the increase in the number of scan paths structuring the shift registers 200. Furthermore, explanations are limited to the control of the pattern correcting device 220 in the examples in FIGS. 8 to 11B. However, the control of the unknown value mask device 230 is carried out at the same time in the normal LSI test. Therefore, the reduction of the data amount is expected in the same manner also with respect to the control signals of the unknown value mask device 230.

According to a semiconductor integrated circuit as explained above, a test data generating device, an LSI test device, and a computer product of the present invention, it is possible to realize a high quality LSI test, and to reduce the data amount of test data of the LSI test.

What is claimed is:

1. A semiconductor integrated circuit comprising:
a generator that generates a random test pattern;
a plurality of shift registers that are specified by address bits and receive a plurality of values included in the random test pattern, respectively; and
a correcting device that corrects, based on a first signal specifying first shift registers having same upper bits of the address bits, values to be input to the first registers, wherein
the correcting device releases, when a value to be input to a second shift register that is one of the first shift registers is inappropriately corrected, correction of the value based on a second signal specifying the second shift register.

2. A test-data generating device that generates test data using design data of a semiconductor integrated circuit that includes a generator that generates a random test pattern; a plurality of shift registers that are respectively specified by address bits and receive the random test pattern; and a correcting device that corrects a value of the random test pattern according to a control signal input from outside, the test-data generating device comprising:
a first generating unit that generates a test pattern for a test;
a comparing unit that compares the test pattern and the random test pattern;
a second generating unit that generates a first signal and a second signal, the first signal specifying first shift registers that have same upper bits of address bits and are to be subjected to a correction based on a result of comparison performed by the comparing unit, the second signal specifying, among the first shift registers, a second shift register to be subjected to a release of correction; and
a storing unit that stores the first signal and the second signal as test data at timing of a pattern shift of the test pattern.

3. A test device that performs a fault test on a semiconductor integrated circuit using test data generated by a test-data generating device, the semiconductor integrated circuit including a generator that generates a random test pattern; a plurality of shift registers that are respectively specified by address bits and receive the random test pattern; and
a correcting device that corrects a value of the random test pattern according to a control signal input from outside, the test-data generating device including a first generating unit that generates a test pattern for a test; a comparing unit that compares the test pattern and the random test pattern; a second generating unit that generates a first signal and a second signal, the first signal specifying first shift registers that have same upper bits of address bits and are to be subjected to a correction based on a result of comparison performed by the comparing unit, the second signal specifying, among the first shift registers, a second shift register to be subjected to a release of correction; and a storing unit that stores the first signal and the second signal as test data at timing of a pattern shift of the test pattern, the test device comprising:
a control unit that reads the first signal and the second signal from the storing unit to output to the correcting unit; and
a detecting unit that detects a fault of the semiconductor integrated circuit by comparing an output value output from the shift registers and an expected value of the test data.

* * * * *